United States Patent [19]
Enraku et al.

[11] Patent Number: 5,488,238
[45] Date of Patent: Jan. 30, 1996

[54] ARRANGEMENT OF POWER SUPPLY LINES USED IN A UNIT FUNCTIONAL BLOCK

[75] Inventors: Motohiro Enraku; Yutaka Tanaka, both of Yokohama, Japan

[73] Assignee: Kabushiki Kaisha Toshiba, Kawasaki, Japan

[21] Appl. No.: 425,333

[22] Filed: Apr. 18, 1995

Related U.S. Application Data

[63] Continuation of Ser. No. 20,459, Feb. 22, 1993, abandoned, which is a continuation of Ser. No. 720,700, Jun. 25, 1991, abandoned.

[30] Foreign Application Priority Data

Jun. 25, 1990 [JP] Japan .................................... 2-164321

[51] Int. Cl.⁶ ................................................. H01L 27/10
[52] U.S. Cl. ......................... 257/207; 257/208; 257/210; 257/211; 257/204; 307/43
[58] Field of Search ..................... 357/45 M, 71; 307/465, 303.2, 443, 481, 43, 42, 409, 71; 257/207, 208, 210, 211, 202, 204

[56] References Cited

U.S. PATENT DOCUMENTS

| | | | |
|---|---|---|---|
| 4,947,229 | 8/1990 | Tanaka et al. | 257/207 |
| 5,012,443 | 4/1991 | Ema | 257/296 |
| 5,045,725 | 9/1991 | Sasaki et al. | 257/208 |
| 5,119,168 | 6/1992 | Misawa | 257/691 |

FOREIGN PATENT DOCUMENTS

| | | | |
|---|---|---|---|
| 0206254 | 9/1986 | Japan | 257/208 |
| 63-265446 | 11/1988 | Japan | 257/202 |
| 1-175241 | 7/1989 | Japan | 257/211 |
| 2-90675 | 3/1990 | Japan | 257/207 |

*Primary Examiner*—Sara W. Crane
*Assistant Examiner*—John Guay
*Attorney, Agent, or Firm*—Finnegan, Henderson, Farabow, Garrett & Dunner

[57] ABSTRACT

A plurality of circuit blocks are arranged in the longitudinal direction in which data is transferred, and this pattern of the longitudinally arranged circuit blocks is repeated laterally. The identical circuit blocks repeated laterally are provided with a common control line pattern. The main power-supply line pattern is formed longitudinally on the axes of symmetry for the repetition of the circuit blocks.

6 Claims, 8 Drawing Sheets

ARRANGEMENT OF POWER SUPPLY LINES USED IN A UNIT FUNCTIONAL BLOCK

This application is a continuation of application Ser. No. 08/020,459, filed Feb. 22, 1993, which is a continuation application of Ser. No. 07/720,700, filed Jun. 25, 1991, both now abandoned.

BACKGROUND OF THE INVENTION

1. Field of the Invention

This invention relates to a CMOS semiconductor integrated circuit device with a multilayer wiring structure, and more particularly to a pattern layout of power-supply lines used in a unit functional block composed of identical blocks arranged repeatedly, such as data paths.

2. Description of the Related Art

Figure 1A:
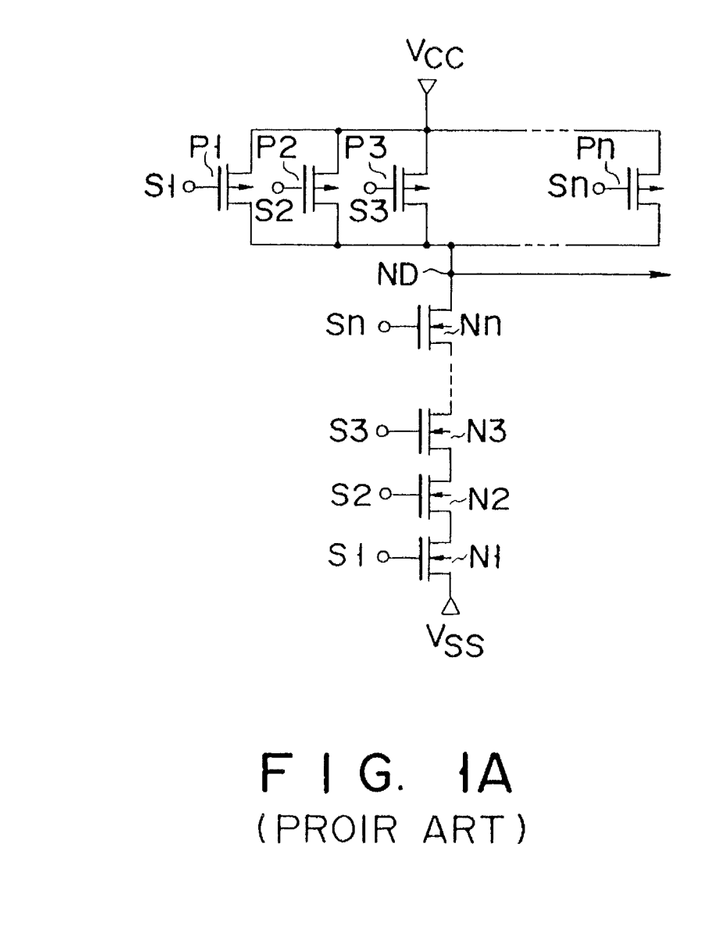
FIG. 1A is a circuit diagram for a CMOS n-input NAND circuit as a basic cell used in a conventional multilayer-wiring CMOS semiconductor integrated circuit device.
Figure 1B:
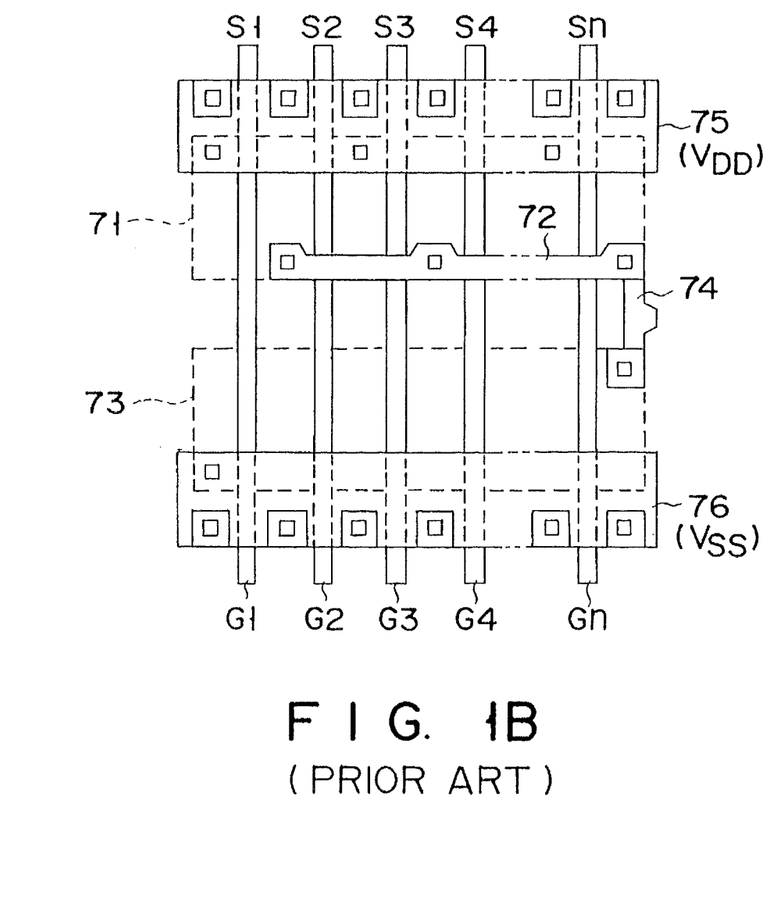
FIG. 1B is a plan view for a pattern layout of the n-input NAND circuit of FIG. 1A.

FIGS. 1A and 1B show the circuit schematic and pattern layout of an ordinary CMOS n-input NAND circuit as a basic cell used in a CMOS semiconductor integrated circuit device with a multilayer wiring structure. As shown in FIG. 1A, the current paths of p-channel transistors P1 through Pn, the individual gates of which receive input signals S1 through Sn, respectively, are connected in parallel between the power supply $v_{cc}$ and the output node ND. The current paths of n-channel transistors N1 through Nn, the individual gates of which receive input signals S1 through Sn, respectively, are connected in series between the output node ND and the ground point $V_{ss}$.

As shown in FIG. 1B, the gate lines G1 through Gn respectively receiving the input signals S1 through Sn are formed longitudinally, being separate from each other. These gate lines G1 through Gn are shared by the transistors whose gates receive the same signal: transistors P1 and N1, transistors P2 and N2, ..., transistors Pn and Nn. The drain and source regions 71 of each of the transistors P1 through Pn are formed in the semiconductor bodies (the n-type semiconductor substrate or the n-well regions) on both sides of each of the gate lines G1 through Gn. The drain common line 72 is formed so as to cross the gate lines G1 through Gn at right angles (in the lateral direction), and is connected to the individual drain regions of the transistors P1 through Pn. Interposed between the drain common line 72 and the semiconductor body is an insulating film (not shown), in which contact holes are formed, through which the line 72 is electrically connected to each drain region. The source and drain regions 73 of each of the transistors N1 through Nn is formed in the semiconductor bodies (the p-well regions or the p-type semiconductor substrate) on both sides of each of the gate lines G1 through Gn, separately from the region 71. The output line 74 of the NAND circuit is connected to both the drain common line 72 and the drain region of the transistor Nn. The power lines (the $V_{DD}$ line and $V_{SS}$ line) 75 and 76 are formed laterally or in the direction of channel length of individual transistors P1 through Pn and N1 through Nn, separately from each other. The $V_{DD}$ line 75 is electrically connected to the individual source regions of transistors P1 through Pn. The $V_{SS}$ line 76 is electrically connected to the source region of transistor N1.

For such basic cells, the circuit pattern height (the longitudinal length) and the power supply pattern width are standardized so as to allow other basic cells to be formed immediately next to a basic cell on both sides.

Figure 2A:
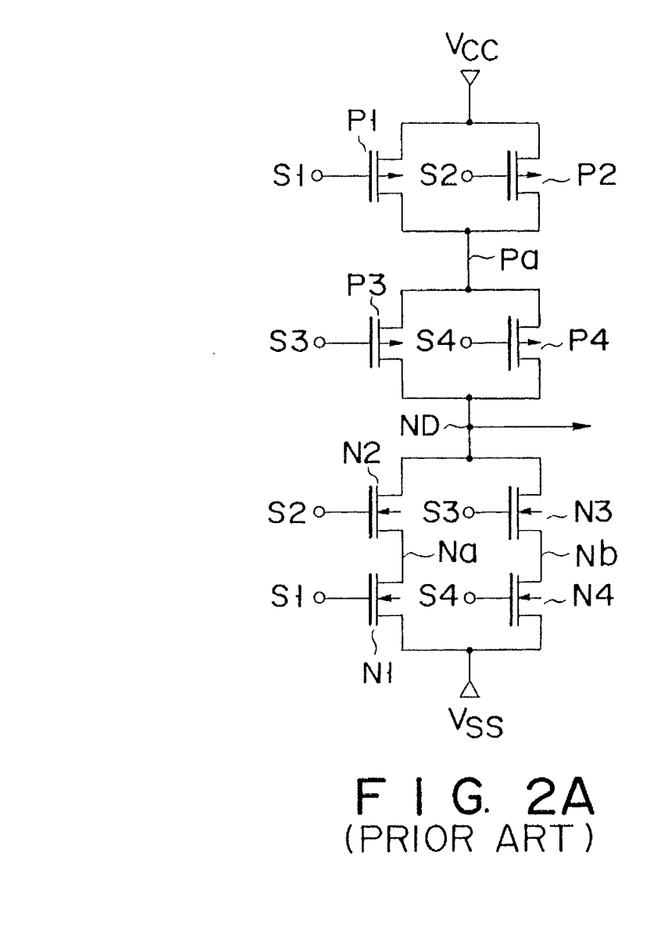
FIG. 2A is a circuit diagram for a CMOS composite-gate circuit as another basic cell used in a conventional multi-layer-wiring CMOS semiconductor integrated circuit device.
Figure 2B:
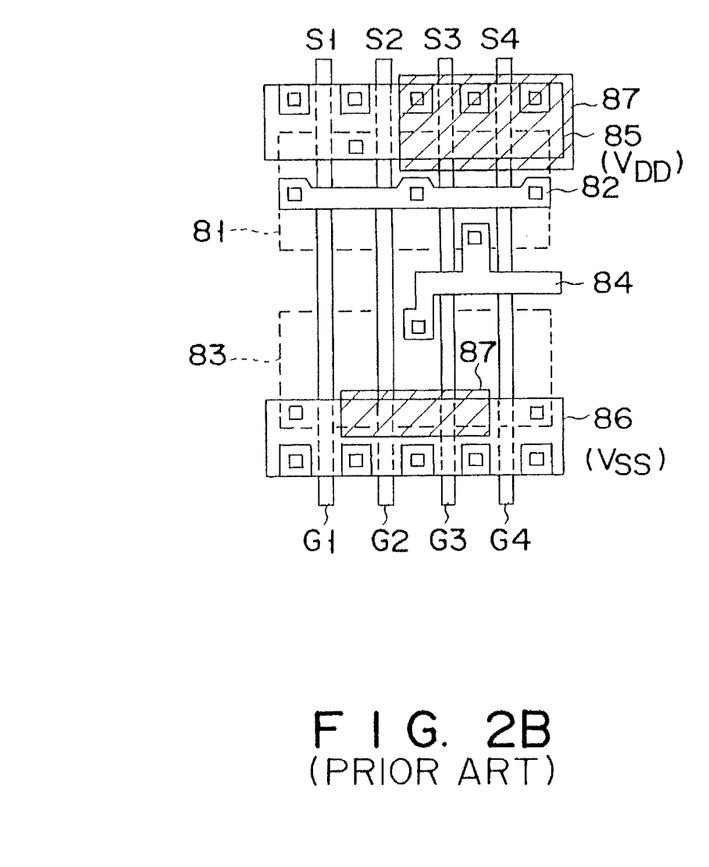
FIG. 2B is a plan view for a pattern layout of the composite-gate circuit of FIG. 2A.

FIGS. 2A and 2B show the circuit schematic and the pattern layout of a CMOS composite gate circuit essential for higher integration and faster speed, as another example of a conventional basic cell. This circuit is composed of p-channel transistors P1 through P4, whose gates receive input signal S1 through S4, respectively, and n-channel transistors N1 through N4, whose gates receive input signal S1 through S4, respectively. The current paths of transistors P1 and P2 are connected in parallel between the power supply $V_{cc}$ and the node Pa, while the current paths of transistors P3 and P4 are connected in parallel between the node Pa and the output node ND. The current paths of transistors N2 and N1 are connected in series between the output node ND and the ground point $V_{ss}$. Similarly, the current paths of transistors N3 and N4 are connected in series between the node ND and the point $V_{ss}$.

As shown in FIG. 2B, the gate lines G1 through G4 receiving input signals S1 through S4 are formed longitudinally, being separate from each other. These gate lines G1 through G4 are shared by the transistors whose gates receive the same signal: transistors P1 and N1, transistors P2 and N2, ..., transistors P4 and N4. The drain and source regions 81 of each of the transistors P1 through P4 are formed in the semiconductor bodies (the n-type semiconductor substrate or the n-well regions) on both sides of each of the gate lines G1 through G4. The intermediate connection line 82 of the transistor portion is formed so as to meet the gate lines G1 through Gn at right angles (laterally), and is connected to the drain regions of transistors P1 and P2 and to the source regions of transistors P3 and P4. Interposed between the intermediate connection line 82 and the semiconductor bodies is an insulating film (not shown), in which contact holes are formed, through which the line 82 is electrically connected to each of the drain and source regions. The source and drain regions 83 of each of n-channel transistors N1 through N4 are formed in the semiconductor bodies (the p-well regions or the p-type semiconductor substrate) on both sides of each of the gate lines G1 through G4, separately from the region 81. The output line 84 of the composite gate 84 is connected to both the common drain region of transistors P3 and P4 and the common drain region of transistors N2 and N3. The power lines (the $V_{DD}$ line 85 and $V_{SS}$ line 86) are formed laterally or in the direction of channel length of individual transistors P1 through P4 and N1 through N4. The $V_{DD}$ line 85 is connected to the source regions of transistors P1 and P2, while the $V_{SS}$ line 86 is connected to the source regions of transistors N1 and N4.

However, a basic cell with the pattern layout as shown in FIG. 2B has many unused spaces or wasted 87 under and near the power lines 85 and 86. As composite gates are used more positively, a smaller percentage of the transistors used are directly supplied with power, resulting in more dead spaces 87. For a basic cell with the above structure, although in some cases, the transistor width may be narrowed for higher integration on the basis of the calculated loads for the intermediate connection points Pa, Na, and Nb, the restrictions due to the power supply lines prevent the pattern area from being minimized. In other words, conventional pattern layouts for power lines are unsuitable for positive use of composite gates.

In a layout of a data path system using multilayer wiring CMOS semiconductor integrated circuit devices, the width of each basic cell is kept constant and circuit patterns or different basic cells are arranged in the longitudinal direction in which data is transferred. Further, the pattern of the longitudinally arranged circuit blocks is repeated in the lateral direction, with a common control signal wiring pattern and a power supply wiring pattern being provided for those laterally repeated identical basic cells. These wiring patterns are formed of layers below the layer to which the power lines belong.

In a data path system where data flows with regularity and the direction of data transfer is at right angles to the direction of control signal transfer, the identical basic cells repeated laterally are switched at the same time. In this case, if a power supply line with a constant width is shared by the laterally repeated basic cells, noise is liable to be induced on the power line at the moment of simultaneous switching.

Figure 3A:
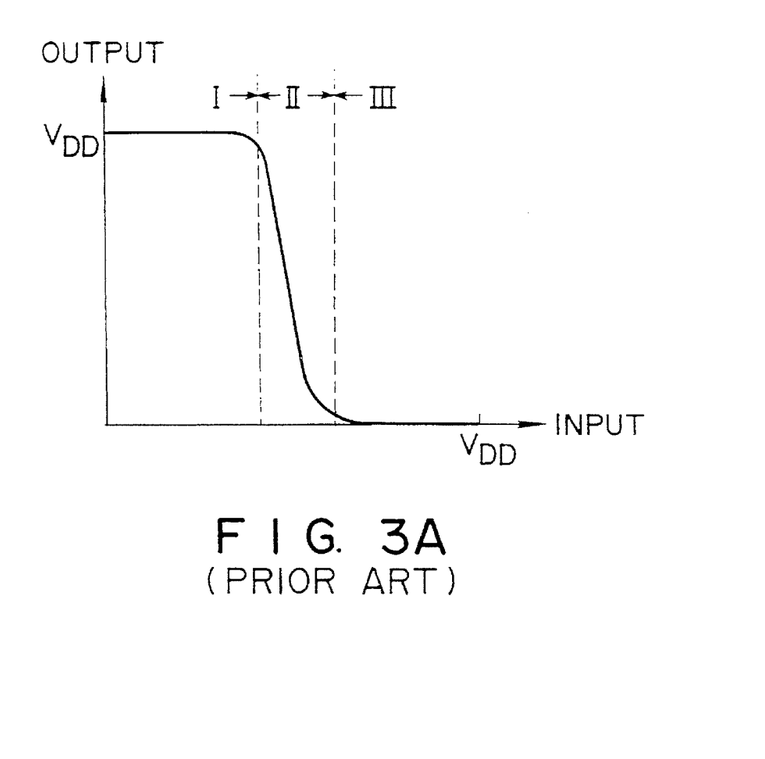
FIG. 3A is the input-output transfer characteristics of a CMOS inverter used as a basic cell.
Figure 3B:
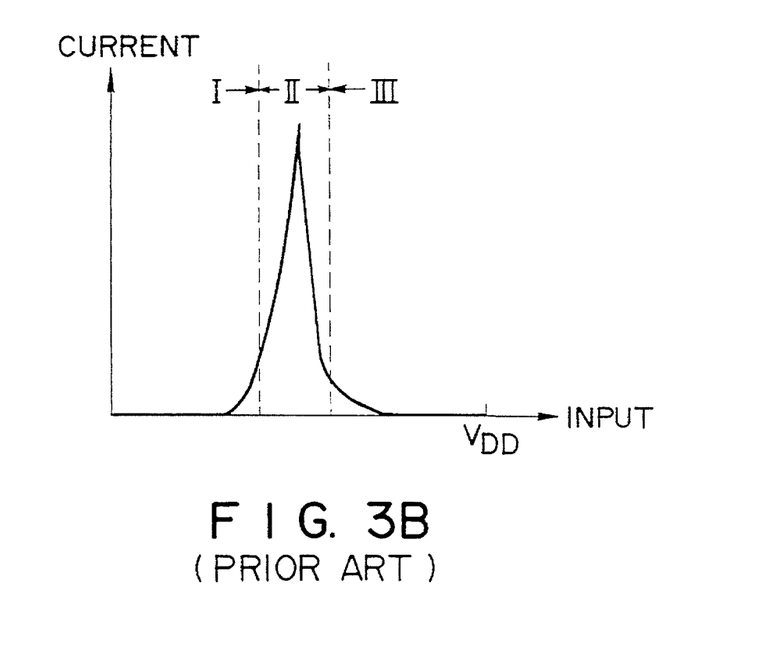
FIG. 3B is the direct-current characteristics in a transitional state of a CMOS inverter used as a basic cell.

FIGS. 3A and 3B show the input-to-output transfer characteristics and the direct-current characteristics in a transitional state for a CMOS inverter used as a basic cell. Since in the transient state II, a large current (ranging from several tens to several hundreds of uA) flows compared to the high level output state I and the low level output state III, it is understood that noise is liable to be induced on the power lines.

To restrain noise from occurring, the power lines are widened or a circuit block with a special noise preventive pattern is provided. The former measure, however, increases unused spaces, which imposes more restrictions on pattern formation in standardizing power supply wiring, lowering the flexibility in pattern design. The latter complicates the pattern layout, making it more difficult to use a CAD (Computer-Aided Design) device for automatic pattern generation.

As described above, the pattern layout of the power supply wiring in a conventional semiconductor integrated device is unsuitable for positive use of composite gates, because the formation of composite gate circuits leads to many unused spaces. Further, since the gates are formed in the direction perpendicular to the direction of regular signal flow peculiar to a data path system, noise is liable to be induced on the power supply lines at the moment of simultaneous switching. To cope with this noise problem, more restrictions must be placed on pattern formation in standardizing power supply wiring, which causes many drawbacks, including the decreased flexibility in pattern design and a complicated pattern layout that makes automatic pattern generation by a CAD device more difficult.

SUMMARY OF THE INVENTION

Accordingly, an object of the present invention is to provide a semiconductor integrated circuit device with a pattern layout of power supply lines suitable for more positive use of composite gates, which reduces the number of unused spaces to improve the packing density.

Another object of the present invention is to provide a semiconductor integrated circuit device that has a pattern layout of power supply wiring capable of reducing power supply noise in a data path system where data flows with regularity and the direction of data transfer is at right angles to the direction of control signal transfer.

Still another object of the present invention is to provide a semiconductor integrated circuit device that decreases the number of restrictions on pattern formation in standardizing power supply wiring to enable a CAD device to perform pattern design with high flexibility and great efficiency.

The foregoing objects are accomplished by a semiconductor integrated circuit, comprising: a pattern that forms a plurality of circuit blocks arranged in a first direction in which data is transferred, the plurality of circuit blocks being repeated in a second direction at an angle with the first direction; a control signal line pattern for supplying the same control signal to identical circuit blocks formed repeatedly in the second direction; and a main power-supply line pattern formed, in the first direction, on the axes of symmetry for repetition of the pattern of the circuit blocks arranged in the first direction.

With this arrangement, since the control signal line pattern, which is shared by the identical circuit blocks repeated in the first direction, crosses the main power-supply line pattern extending in the second direction, simultaneous switching of basic cells repeated in the second direction hardly permits noises to be induced on the power lines. Furthermore, since the main power-supply line pattern is placed on the symmetry axes for repetition of the circuit blocks arranged in the first direction, these blocks can share the main power-supply lines, which reduces the number of restrictions on pattern formation in standardizing power wiring, allowing highly flexible and efficient pattern design and a higher packing density.

Addition of a branch power-supply line pattern, which is formed of a wiring layer different in level from the pattern to which the main power-supply line pattern belongs, enables the electrical connection of the main power-supply line pattern with the semiconductor elements in the circuit blocks via this additional pattern. Since the branch power-supply lines may be placed in either the first direction or the second direction, as required, this decreases unused spaces which are unusable due to the existence of power supply lines, which leads to the reduced pattern area. Therefore, this configuration is suitable for positive use of composite gates.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 4:
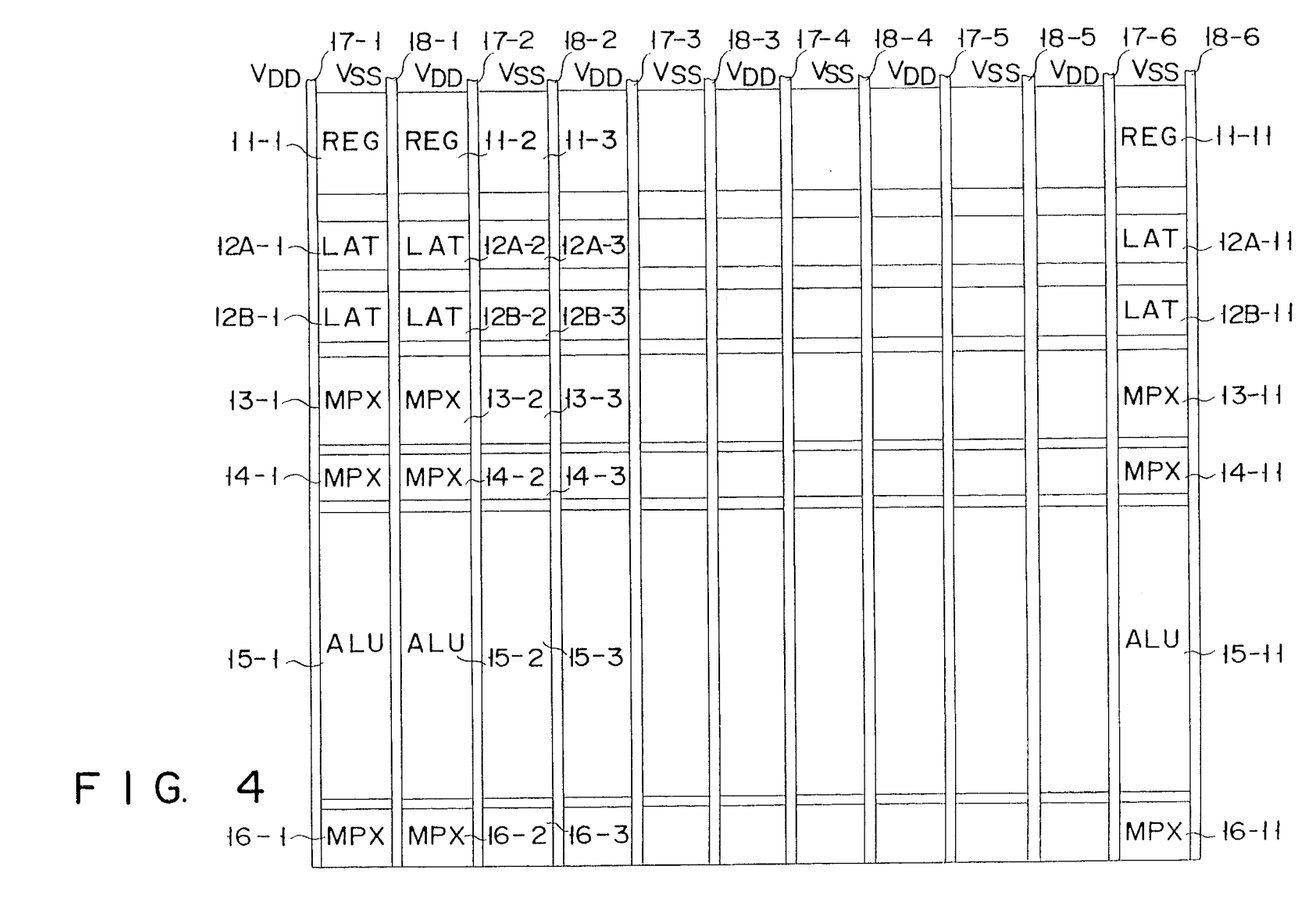
FIG. 4 is a plan view for a pattern layout of the data path system in a semiconductor integrated circuit device according to an embodiment of the present invention.

FIG. 4 shows a layout for a data path system in a multilayer-wiring CMOS semiconductor integrated circuit device according to an embodiment of the present invention. This data path system essentially consists of register circuit regions 11-1 through 11-11, latch circuit regions 12A-1 through 12A-11 and 12B-1 through 12B-11, 4-input 1-output multiplexer regions 13-1 through 13-11, 2-input 1-output multiplexer regions 14-1 through 14-11, arithmetic and logic unit (ALU) regions 15-1 through 15-11, and 2-input 1-output multiplexer regions 16-1 through 16-11. In this system, a plurality of basic cells, each of which has the same width but a different function, are arranged in the longitudinal direction in which data is transferred. The pattern of the longitudinally arranged circuit blocks is repeated in the lateral direction. (Although in FIG. 4, the patterns for only 11 bits are shown, they are not limited to 11 bits.) A control signal line pattern (not shown) is provided which is common to the individual circuits repeated in the lateral direction, whereas the main power supply line patterns ($V_{DD}$ lines 17-1 through 17-6 and $V_{SS}$ lines 18-1 through. 18-6) extend longitudinally on the symmetry axes for repetition of the pattern of the longitudinally arranged circuit blocks. That is, the patterns of register circuit regions 11-1 and 11-2, latch circuit regions 12A-1 and 12A-2, 12B-1 and 12B-2, multiplexer regions 13-1 and 13-2, multiplexer regions 14-1 and 14-2, ALU regions 15-1 and 15-2, and multiplexer regions 16-1 and 16-2 are each line-symmetric with respect to the $V_{DD}$ line 17-1. Similarly, the patterns of register circuit regions 11-2 and 11-3, latch circuit regions 12A-2 and 12A-3, 12B-2 and 12B-3, multiplexer regions 13-2 and 13-3, multiplexer regions 14-2 and 14-3, ALU regions 15-2 and 15-3, and multiplexer regions 16-2 and 16-3 are each line-symmetric with respect to the $V_{SS}$ line 18-1. The same holds true for the remaining regions.

Figure 5:
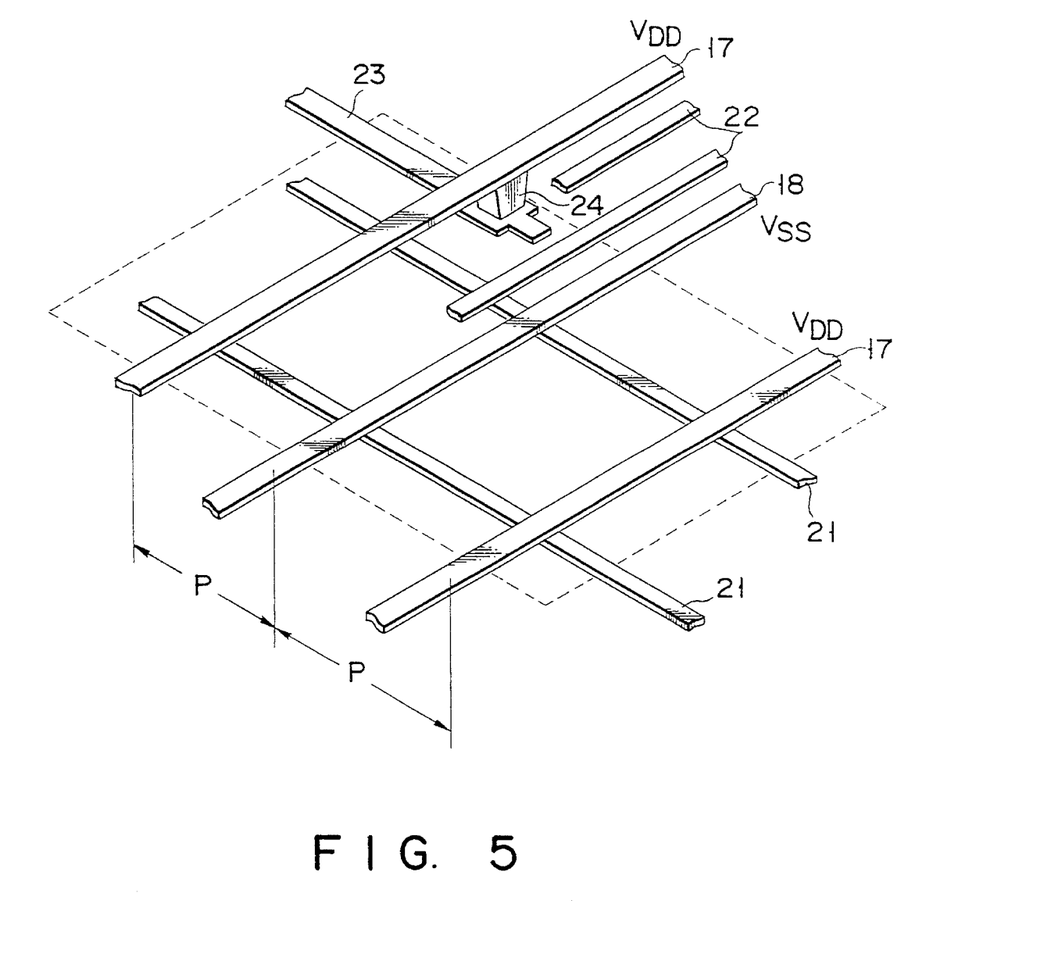
FIG. 5 is a perspective view of a wiring arrangement above an element region in the pattern of FIG. 4.

FIG. 5 is a perspective view for a wiring arrangement above an element region in the pattern layout of FIG. 4. The control signal line pattern 21 including clock lines and register file word lines is formed of a first layer. The data line pattern 22 is formed longitudinally of a second wiring layer. The main power-supply line pattern ($V_{DD}$ lines 17 and $V_{SS}$ lines 18) is formed, in parallel with the data line pattern 22, of the second wiring layer (the same level of wiring layer that the data line pattern 22 belongs to) at intervals of P. The branch power-supply line pattern 23 formed of the first wiring layer is for supplying power from the main power-supply line pattern to individual circuits. The connection portion 24 is for connecting the main power-supply line pattern of the second layer to the branch power-supply line pattern of the first layer. The branch power-supply line pattern 23 may be formed either longitudinally or laterally.

In the semiconductor integrated circuit device with such a power-supply line pattern layout, the main powersupply line patterns 17 and 18 extend in the longitudinal direction perpendicular to the control signal line pattern 21 shared by the identical basic cells repeated in the lateral direction. This arrangement makes it difficult for noise to be induced on the power supply lines at the moment the laterally repeated basic cells are switched at the same time. Therefore, there is no need to give allowance to the width of power supply lines or provide a circuit block with a special pattern to prevent power supply noises. As a result, neither unused spaces increase in the number, nor the pattern layout becomes more complicated. In addition, since a pattern resembling the power supply pattern suitably designed by handicraft can be created by the repetition of simpler blocks, this facilitates automatic pattern generation by a CAD device. In the structures of FIGS. 1B and 2B, where the power supply lines with a constant width 75 and 76, and 85 and 86 are shared by the identical basic cells repeated in the lateral direction, as the number of bits increases, the circuits become more susceptible to power supply noises. To suppress such noises, those structures require a circuit block with a special pattern every several bits. However, with the pattern of power supply lines in this embodiment, even if the number of bits increases, there is no need to provide such a special circuit.

In this embodiment, the main power-supply lines 17 and 18 are located on the symmetry axes for repetition of the pattern of the longitudinally arranged circuit blocks, which allows the circuit blocks to share the main power-supply lines. This reduces the number of restrictions on pattern formation in standardizing power supply wiring, which allows pattern design with high flexibility and great efficiency, thereby improving the packing density.

The above main power-supply line patterns 17 and 18 are formed, above the control signal line pattern. The patterns 17 and 18 are formed of the same wiring layer that the longitudinally formed data line pattern 22 and to, in parallel with the pattern 22. This further alleviates the restrictions on pattern formation in connection with the standardization of power supply wiring.

Figure 6:
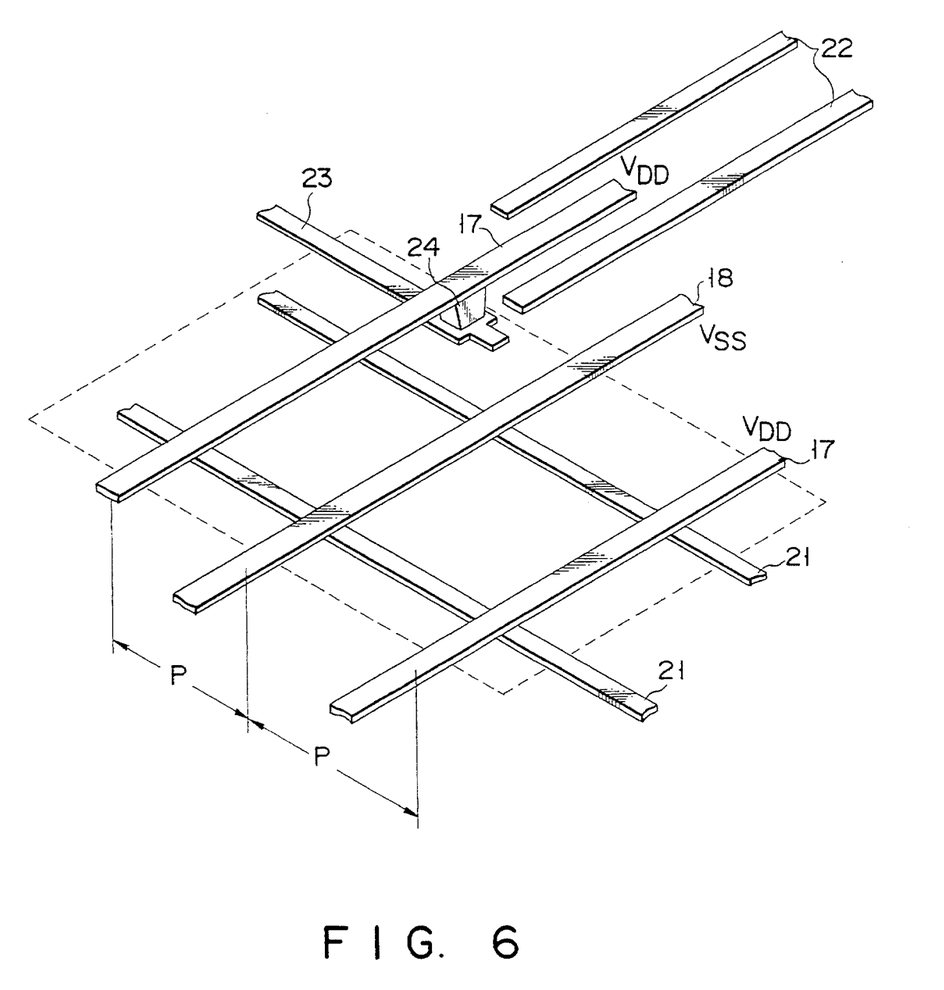
FIG. 6 is a perspective view of another wiring arrangement above the element region in the pattern of FIG. 4.

As shown in FIG. 6, the data wiring pattern 22 may be constructed of a third wiring layer above the main power-supply line patterns 17 and 18.

Figure 7:
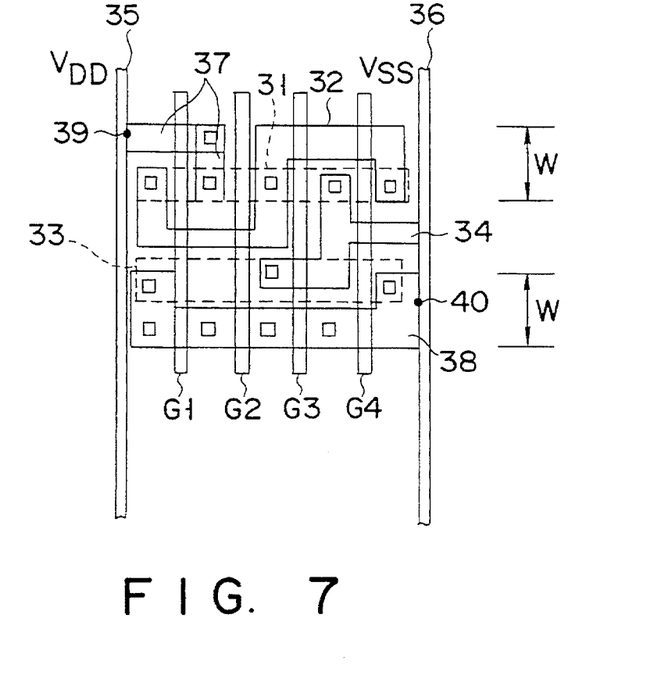
FIG. 7 is a plan view for a pattern layout of a CMOS composite gate circuit used as a basic cell in a semiconductor integrated circuit according to the present invention.

FIG. 7 illustrates a pattern layout of basic cells to which a power supply line pattern layout according to this invention is applied. This pattern layout is an application of the present invention to the composite gate circuit of FIG. 2A. Gate lines G1 through G4 shared by p-channel transistors and n-channel transistors are formed longitudinally, separately from each other. The source and drain regions 31 of each of p-channel transistors are formed in the semiconductor bodies (the n-type semiconductor substrate or the n-well regions) on both sides of each of gate lines G1 through G4. The intermediate connection line 32 of the p-channel transistor portion is connected to the drain region of transistor P1, the drain-source common region of transistors P2 and P3, and the source region of transistor P4. Interposed between the intermediate connection line 32 and the semiconductor bodies is an insulating film (not shown), in which contact holes are made, through which the line 32 is electrically connected to the drain region, drain-source common region, and source region. The source and drain regions 33 of each of n-channel transistors are formed in the semiconductor bodies (the p-well regions or the p-type semiconductor substrate) on both sides of each of gate lines G1 through G4, separately from the region 31. The output line 34 of the composite gate circuit is connected to the common drain region of transistors P3 and P4 and the common drain region of transistors N2 and N3. The $V_{DD}$ main power-supply line 35 and $V_{SS}$ main power-supply line 36 are formed longitudinally, or in the direction of channel width of transistors P1 through P4, and N1 through N4, so as to sandwich these transistors between them. The pattern 37 of $V_{DD}$ branch power-supply line connects the $V_{DD}$ main power-supply line 35 to the source regions of transistors P1 and P2 via the power supply connection portion 39. The $V_{SS}$ branch power-supply line 38 connects the VSS main power-supply line 36 to the source regions of transistors N1 and N4 via the power supply connection portion 40.

This composite gate circuit enables the branch power-supply lines 37 and 38 to be positioned laterally or longitudinally as desired, so that the number of dead spaces, which are unusable due to the existence of power supply lines, is decreased, which leads to a decrease in the pattern area. Thus, this arrangement is suitable for positive use of composite gates. This feature works more effective as the transistor width gets thinner through optimization and the number of transistors directly powered is smaller. In contrast to this, the conventional pattern layout of the composite gate circuit of FIG. 2B has the power supply lines 85 and 86 with a width W larger than a certain value which are at right angles to the channel width of transistor, imposing restrictions on pattern formation.

Figure 8:
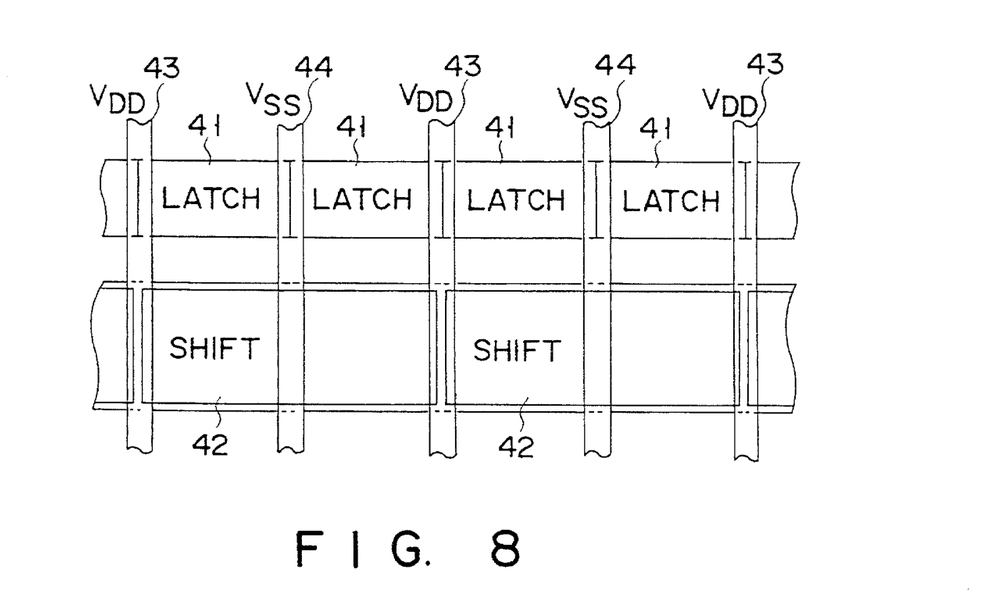
FIG. 8 is a plan view for a pattern layout that has basic cells of one type repeated every other bit and basic cells of the other type repeated every three bits, in the lateral direction in a semiconductor integrated circuit device.

FIG. 8 illustrates another layout of basic cells to which a power-supply line layout of this invention is applied. This layout is an example of a circuit pattern in which basic cells of one type (e.g., latch circuits 41) are repeated laterally every other bit and basic cells of the other type (e.g., shift circuits 42) are repeated laterally every three bits. $V_{DD}$ main power-supply lines 43 and $V_{SS}$ main power-supply lines 44 are alternately formed on the symmetry axes for the repetition of every bit. With this layout, it is possible to longitudinally arrange several types of basic cells in various patterns, each type being the same in width and different in height.

Figure 9:
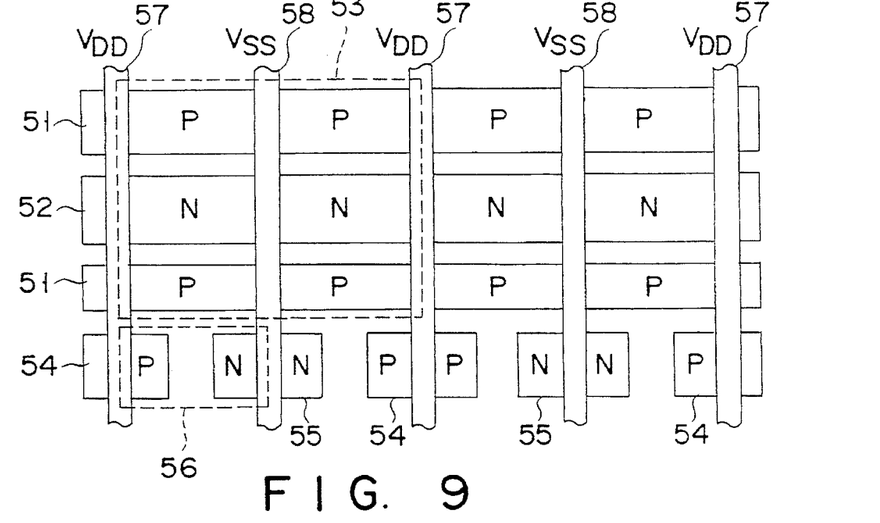
FIG. 9 is a plan view for a pattern layout that has two types of functional blocks, which differ in the relative position of p-channel region and n-channel region in a semiconductor integrated circuit device.

FIG. 9 shows a circuit pattern containing first functional block regions 53 and second functional block regions 56, the first functional block region 53 having a p-channel transistor region 51 and an n-channel transistor region 52 each repeated laterally in units of 2 bits and divided laterally, and the second functional block region 56 having a p-channel transistor region 54 and an n-channel transistor region 55 repeated laterally every bit and divided longitudinally. $V_{DD}$ main power-supply lines 57 and $V_{SS}$ main power-supply lines 58 are formed on the symmetry axes for repetition of every bit. With this layout, p-channel transistor regions and n-channel transistor regions can be divided into various forms.

Figure 10:
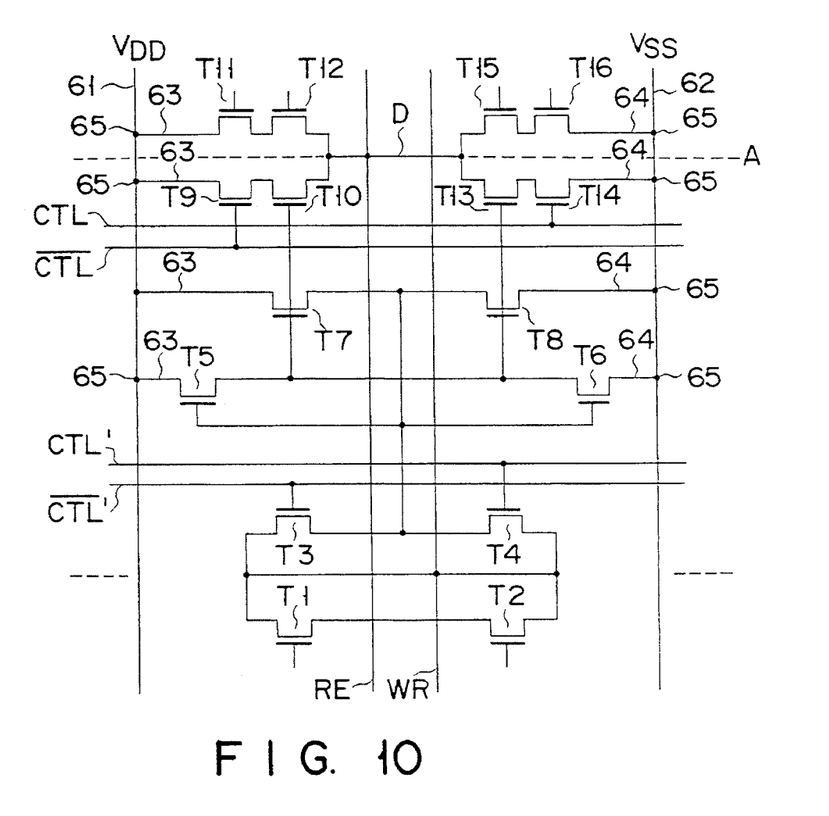
FIG. 10 is a circuit diagram used to explain a pattern layout of a register file used as a basic cell in a semiconductor integrated circuit device of the present invention.

FIG. 10 is a circuit diagram used to explain a circuit pattern layout of a register file (a small-size memory) used as a basic cell. MOS transistors T1 through T4 constitute a write transmission gate. MOS transistors T5 through T8 compose a latch circuit. MOS transistors T9 through T16 make up a read clocked inverter. The control signal lines CTL and CTL' and the inverted control signal lines $\overline{\text{CTL}}$ and $\overline{\text{CTL}'}$ are formed laterally of a first wiring layer. The write signal line WR and the read signal line RE are formed longitudinally of a first wiring layer. $V_{DD}$ main power-supply lines 61 and $V_{SS}$ main power-supply lines 62 are formed, of a second wiring layer, on the symmetry axes for repetition. $V_{DD}$ branch power-supply lines 63 and $V_{SS}$ branch power-supply lines 64 electrically connect the $V_{DD}$ main power-supply lines 61 and $V_{SS}$ main power-supply lines 62 to the source or drain regions of individual transistors.

With such a layout, a plurality of MOS transistors can share their drain regions D on a lateral axis A of symmetry, which enables an improvement in the packing density and a reduction in the drain capacity, leading to the improved circuit characteristics.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit device having a multilayer structure, comprising:

a pattern arranged in a first direction, said pattern forming at least two circuit blocks having semiconductor elements and having different functions, said pattern being arranged repeatedly in a second direction, said second direction being substantially perpendicular to the first direction, wherein each set of two adjacent patterns are line-symmetric with respect to a corresponding boundary line thereof;

means for transmitting a signal sequentially on said two circuit blocks;

a control signal line pattern formed on a first layer and supplying a common control signal to circuit blocks having an identical circuit structure, said control signal line pattern being arranged along said second directional;

a main power-supply line pattern formed on a second layer and arranged along said first direction on the boundary line of said two patterns arranged in the first direction, said main power-supply line pattern including a pattern of voltage supply lines, each of said voltage supply lines supplying power to two adjacent circuit blocks on either side of said each voltage supply, said each voltage supply line supplying power to said at least two different circuit blocks having different functions arranged in said first direction, said second layer disposed above said first layer; and a branch power-supply line pattern for electrically connecting said main power-supply line pattern to the semiconductor elements of said circuit blocks, and for actuating said circuit blocks by supplying said semiconductor elements with the power supplied by said main power-supply line pattern.

2. A semiconductor integrated circuit device according to claim 1, further comprising a data line pattern arranged in the first direction.

3. A semiconductor integrated circuit device according to claim 2, wherein said main power-supply line pattern and said data line pattern are formed on a same layer, said data line pattern being arranged parallel to said main power-supply line pattern.

4. A semiconductor integrated circuit device according to claim 2, wherein said main power-supply line pattern and said data line pattern are formed on different layers.

5. A semiconductor integrated circuit device according to claim 2, wherein said semiconductor elements include a MOS transistor, said branch power-supply line pattern is electrically connected to one of a source region and a drain region of said MOS transistor, and said data line pattern is electrically connected to a gate region of said MOS transistor.

6. A semiconductor integrated circuit device according to claim 1, wherein said semiconductor elements include a MOS transistor, and said branch power-supply line pattern is electrically connected to one of a source region and a drain region of said MOS transistor.

* * * * *